United States Patent
Liu

(10) Patent No.: US 7,714,609 B1
(45) Date of Patent: May 11, 2010

(54) METHOD AND APPARATUS TO POWER DOWN UNUSED CONFIGURATION RANDOM ACCESS MEMORY CELLS

(75) Inventor: Lin-Shih Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/471,327

(22) Filed: May 22, 2009

Related U.S. Application Data

(62) Division of application No. 11/192,628, filed on Jul. 29, 2005, now Pat. No. 7,548,091.

(51) Int. Cl.
*G06F 7/38* (2006.01)
*H03K 19/177* (2006.01)

(52) U.S. Cl. .............................. 326/40; 326/38; 326/39

(58) Field of Classification Search ........................ None
See application file for complete search history.

(56) References Cited

U.S. PATENT DOCUMENTS 6,101,143 A * 8/2000 Ghia .......................... 365/227

7,498,836 B1 * 3/2009 Tuan ........................... 326/38

* cited by examiner

*Primary Examiner*—Anh Q Tran
(74) *Attorney, Agent, or Firm*—Martine Penilla & Gencarella, LLP

(57) ABSTRACT

A method for reducing power consumption for a programmable logic device (PLD) is provided. In the method, configuration cells associated with used logic portions of the PLD are powered. A programmable power signal preventing source to drain leakage is provided to an inverter of a configuration random access memory (CRAM) cell associated with an unused logic portion of the PLD. The programmable power signal deactivates at least a portion of a configuration cell associated with the unused logic portion. That is, the programmable power signal eliminates the source to drain leakage as the power provided to the configuration cell is at ground. In one embodiment, the programmable power signal is provided to both inverters of a cross coupled pair of inverters rather than a single one of the cross-coupled pair of inverters. A programmable logic device capable of minimizing standby power consumption is also included.

7 Claims, 5 Drawing Sheets

METHOD AND APPARATUS TO POWER DOWN UNUSED CONFIGURATION RANDOM ACCESS MEMORY CELLS

CLAIM OF PRIORITY

This Application is a divisional application and claims priority from U.S. patent application Ser. No. 11/192,628, filed on Jul. 29, 2005, now U.S. Pat. No. 7,548,091 entitled, "METHOD AND APPARATUS TO POWER DOWN UNUSED CONFIGURATION RANDOM ACCESS MEMORY CELLS," which is herein incorporated by reference in its entirety for all purposes.

BACKGROUND

This application relates to integrated circuits such as programmable logic array integrated circuits ("programmable logic devices"), and more particularly, to ways in which to reduce power consumption of an integrated circuit.

Programmable logic devices (PLD) are integrated circuit devices where the logic elements may be customized by a user. A customized programmable logic device may be used to perform customized logic functions when the device is operated in a system. To customize a programmable logic device, the device is loaded with configuration information, also referred to as programming data. The programming data may be stored in a flash memory chip, disk drive, or other storage device in the system. Upon power-up, the programming data may be loaded from the flash memory chip or other storage device into configuration random-access memory (CRAM) cells on the programmable logic device. The output of each CRAM cell is either a logic high signal or a logic low signal, depending on the value of the programming data bit stored within the CRAM cell. The output signal from each CRAM cell may be used to control a corresponding circuit element. The circuit element may be, for example, a pass transistor, a transistor in a logic component, such as a multiplexer or demultiplexer, a transistor in a look-up table, or a transistor or other programmable circuit element in any suitable configurable logic circuit.

When the gate of an n-channel metal-oxide-semiconductor (NMOS) transistor that is controlled by a CRAM cell is driven high (because the CRAM cell contains a logic "one"), the transistor is turned on so that signals can pass between its drain and source terminals. When the gate of the transistor is driven low (because the CRAM cell contains a logic "zero"), the transistor is turned off. In this way, the transistors on the programmable logic device and therefore the functionality of the logic on the programmable logic device can be configured.

As the feature size of the transistors making up the integrated circuits is becoming smaller and smaller, leakage is becoming more of a problem, especially between the source and the drain of the corresponding transistors. Excessive leakage current from circuits may lead to a large standby power consumption rate. This large standby power consumption is undesirable as the trend is to reduce power consumption of the integrated circuit.

As a result, there is a need to solve the problems of the prior art to reduce the standby power consumption of an integrated circuit, especially as feature sizes continue to shrink.

SUMMARY

Broadly speaking, the present invention fills these needs by providing a method and apparatus for reducing the standby power consumed by shutting down unused configuration random access memory (CRAM) cells. It should be appreciated that the present invention can be implemented in numerous ways, including as a method, a system, or an apparatus. Several inventive embodiments of the present invention are described below.

In one aspect of the invention, a method for reducing power consumption for a programmable logic device (PLD) is provided. In the method, configuration cells associated with used logic portions of the PLD are powered. A programmable power signal preventing source to drain leakage is provided to an inverter of a configuration random access memory (CRAM) cell associated with an unused logic portion of the PLD. The programmable power signal deactivates at least a portion of a configuration cell associated with the unused logic portion. That is, the programmable power signal eliminates the source to drain leakage as the power provided to the configuration cell is at ground. In one embodiment, the programmable power signal is provided to both inverters of a cross coupled pair of inverters rather than a single one of the cross-coupled pair of inverters.

In another aspect of the invention, a programmable logic device (PLD) is provided. The programmable logic device includes a plurality of storage cells that provide output to configure the PLD. A configuration controlling cell array providing input to each of the plurality of storage cells is also included. The input to each of the storage cells controls power consumption of each of the corresponding storage cells. In one embodiment, the configuration controlling cell array receives programming data upon initialization of the programmable logic device. In another embodiment, the storage cells that provide output for configuring the PLD activate a logic connector of the PLD. The storage cells include a pair of cross-coupled inverters. Each of the cross-coupled inverters has an input terminal for receiving a respective programmable power level signal from the configuration storage cell according to the programming data. The programmable power level signal deactivates at least one of the cross-coupled inverters. The storage cell receiving the power level signal is associated with an unused portion of the PLD. In one embodiment, the programmable power level substantially eliminates source to drain leakage across at least one of the cross coupled inverters.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method that reduces standby power consumption for a configurable integrated circuit. It will be obvious, however, to one skilled in the art, that the present invention may be practiced without some or all of these specific details. In other instances, well known process operations have not been described in detail in order not to unnecessarily obscure the present invention.

The embodiments described herein describe a method and device that significantly reduces standby power consumed by an integrated circuit. In one embodiment, a programmable logic device (PLD) having a programming configuration defining the connectivity within the PLD is provided. The programming configuration is loaded within the configuration random access memory (CRAM) of the PLD upon initialization of the PLD. The programming configuration will provide logical signals to corresponding pass gates thereby defining the connectivity within the PLD. A significant amount of pass gates may be "turned off" so as not to allow signals to pass therethrough. The corresponding CRAM cells for these logic gates, while not being used, i.e., their output is a logical low signal, are consuming more standby power as feature sizes continue to shrink. That is, as the feature size of the transistors used to define the CRAM cells continues to shrink, the leakage from the source to the drain of these transistors is increasing, which in turn causes an increase in standby power consumption. The programmable power signals, discussed in more detail below, eliminate the leakage between the source and the drain regions of these transistors used to define the unused CRAM cells.

Figure 1:
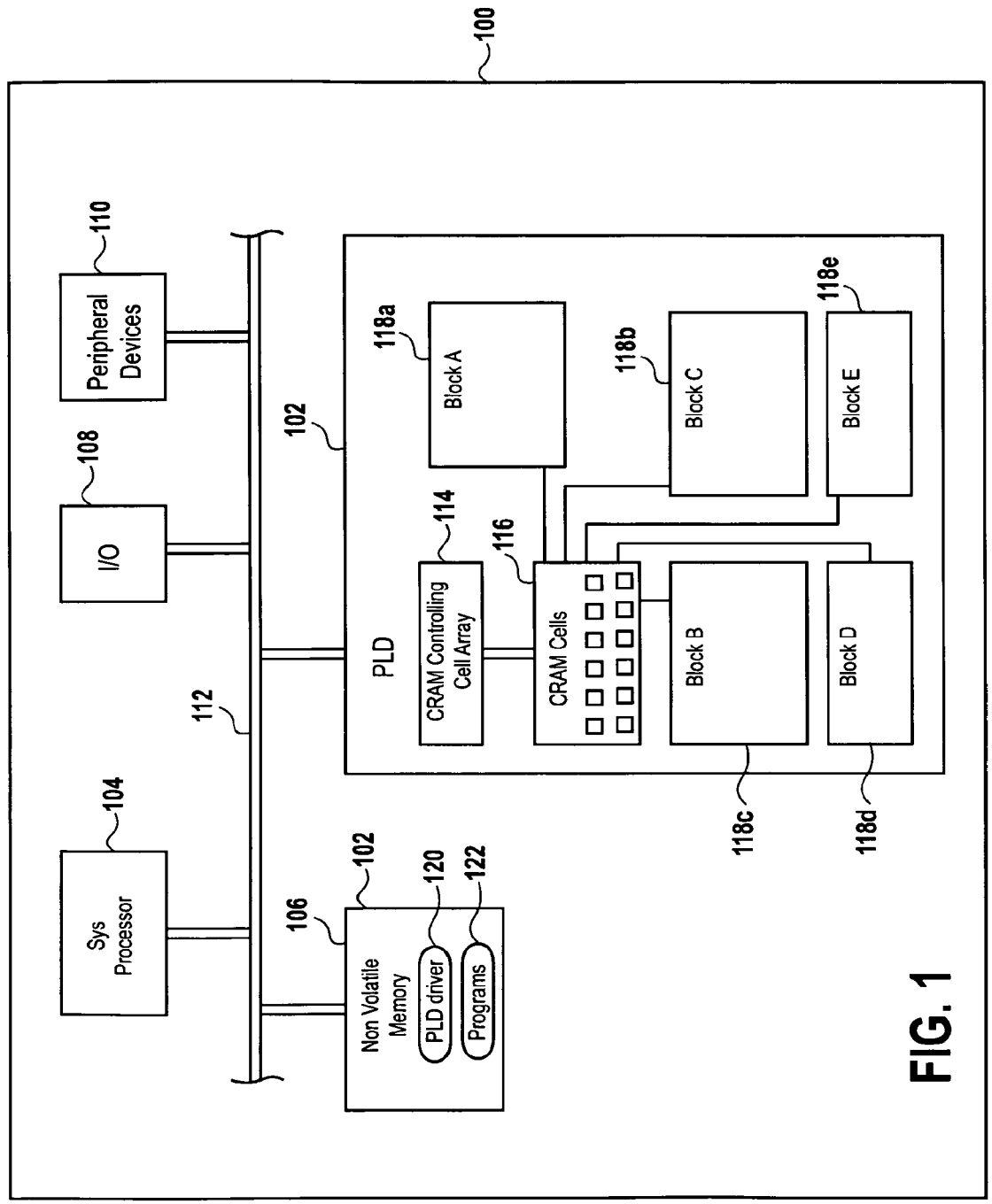
FIG. 1 is a simplified schematic diagram of a programmable logic device (PLD) that is incorporated into a data processing system in accordance with one embodiment of the invention.

FIG. 1 is a simplified schematic diagram of a programmable logic device (PLD) that is incorporated into a data processing system in accordance with one embodiment of the invention. System 100 includes processor 104 input/output (I/O) module 108, peripheral devices 110, non-volatile memory 106, and PLD 102, all of which are connected through bus 112. PLD 102 includes configuration random access memory (CRAM) controlling cell array 114 and CRAM cells 116. It should be appreciated that CRAM cells 116 and CRAM controlling cell array 114 are illustrated as a block of cells for ease of illustration. That is, CRAM cells 116 and the cells of CRAM controlling cell array 114, may be distributed and dispersed throughout PLD 102, rather than being located in a block. CRAM cells 116 provide the programming configuration for interconnecting certain blocks, e.g., blocks A through E, 118a through 118e, to configure PLD 102. For example CRAM cells 116 can provide signals "turning on" and "turning off" pass gate transistors to define the connectivity within the PLD. It will be apparent to one skilled in the art that blocks A through E, 118a through 118e, may perform any suitable functionality commonly performed by blocks of a PLD. Some exemplary functions of blocks A through E, 118a through 118e include digital signal processing, memory functionality, or any other suitable logic function, etc. It should be appreciated that upon start up or initialization of system 100, PLD driver 120 stored in non-volatile memory 106 will provide the programming information, e.g., a bit sequence, to PLD 102 over bus 112.

As illustrated in FIG. 1, PLD driver 120 and programs 122 are stored in non-volatile memory 106. It should be noted that non-volatile memory 106 may be any suitable data source that maintains its contents when powered down. Some exemplary structures include a read-only memory (ROM), flash memory, erasable ROM, a source that supplies a bit-stream of data, a storage device, and the like. Non-volatile memory 106 provides the programmable power level signals to the corresponding cells of CRAM controlling cell array 114, as well as the configuration data for CRAM cells 116, in accordance with one embodiment of the invention. Of course, the programmable power level signals and the configuration data may reside in separate memory regions. The cells of CRAM controlling cell array 114 provide the programmable power level signal to corresponding CRAM cells 116. In one embodiment, the programmable power level signal is either a logical high value or a logical low value depending on whether corresponding CRAM cells 116 are associated with an active or an inactive logic region.

System 100 may be used in a wide-variety of applications, such as computer networking, data networking, instrumentation, video processing, digital signal processing, or any other suitable application where the advantage of using programmable logic is desired. PLD 102 may be used to perform a variety of different logic functions. For example, PLD 102 can be configured as a processor or controller that works in cooperation with processor 104. PLD 102 may also be used as an arbiter for arbitrating access to a shared resource within system 100. In yet another example, PLD 102 may be configured as an interface between processor 104 and one of the other components listed within system 100. It should be appreciated that system 100 is one exemplary use of a PLD and not meant to be limiting.

Figure 2A:
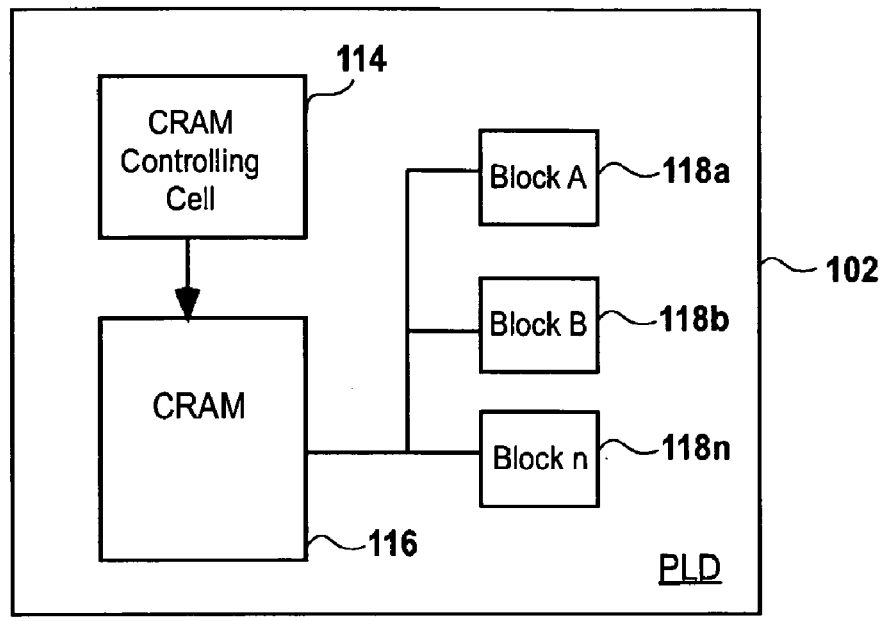
FIGS. 2A and 2B illustrate alternative embodiments for the CRAM controlling cell within the PLD.
Figure 2B:
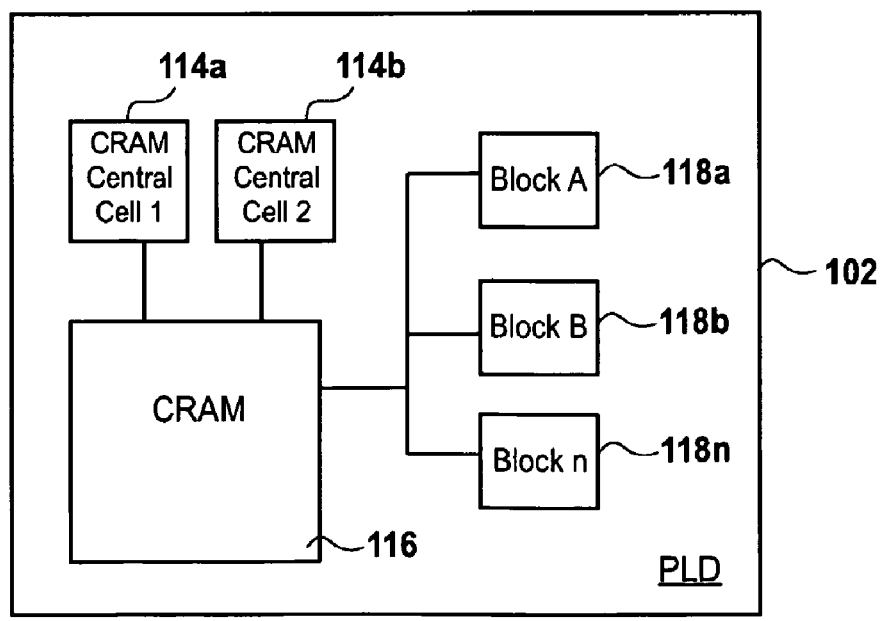

FIGS. 2A and 2B illustrate alternative embodiments for the CRAM controlling cell within the PLD. In FIG. 2A, CRAM controlling cell 114 is in communication with CRAM 116. CRAM 116 programs interconnects to define whether or not blocks A-N, 118a-118n, are functional. CRAM controlling cell 114 is used to provide a programmable power level to at least a portion of corresponding CRAM cells of CRAM 116. Under the embodiments discussed herein, the power consumption for the corresponding CRAM cells of CRAM 116 that are provided with a programmable power level having a logic "0" value is reduced to zero. There is no leakage from the power to ground in this instance, since the power is at ground, as will be explained in more detail with respect to FIGS. 3 through 5. The embodiment represented by FIG. 2A may be used to power down both inverters of a cross-coupled pair in accordance with one embodiment of the invention. That is, the P1 and P2 values referred to below would both be logical "0" values to eliminate source to drain leakage across both inverters of a cross coupled pair.

With regard to FIG. 2B, PLD 102 includes separate CRAM controlling cells for supplying separate programmable power levels to corresponding CRAM cells. CRAM controlling cell 1 114a and CRAM controlling cell 2 114b are in communication with CRAM 116. As discussed with reference to FIG. 2A, CRAM 116 provides the configuration data to configure PLD 102. It should be noted that CRAM controlling cells 114a and 114b are provided the programmable power level information upon initialization from a data source such as a non-volatile memory, e.g., the non-volatile memory of FIG. 1. The structure illustrated in FIG. 2B is utilized to provide separate programmable power level signals to each inverter of a cross coupled pair of inverters in one embodiment. In the embodiment depicted by FIG. 2B, half of the CRAM cell, i.e., one inverter of a cross-coupled pair of inverters may be powered. Thus, the programmable power level signal having a logical low value is provided to one of the cross coupled inverters. As will be explained in more detail below, this embodiment may be useful where a logic block associated with the CRAM cell requires both a DATAOUT and a $\overline{\text{DATAOUT}}$ signal. As used herein, $\overline{\text{DATAOUT}}$ refers to the "DATAOUT bar" signal.

Figure 3:
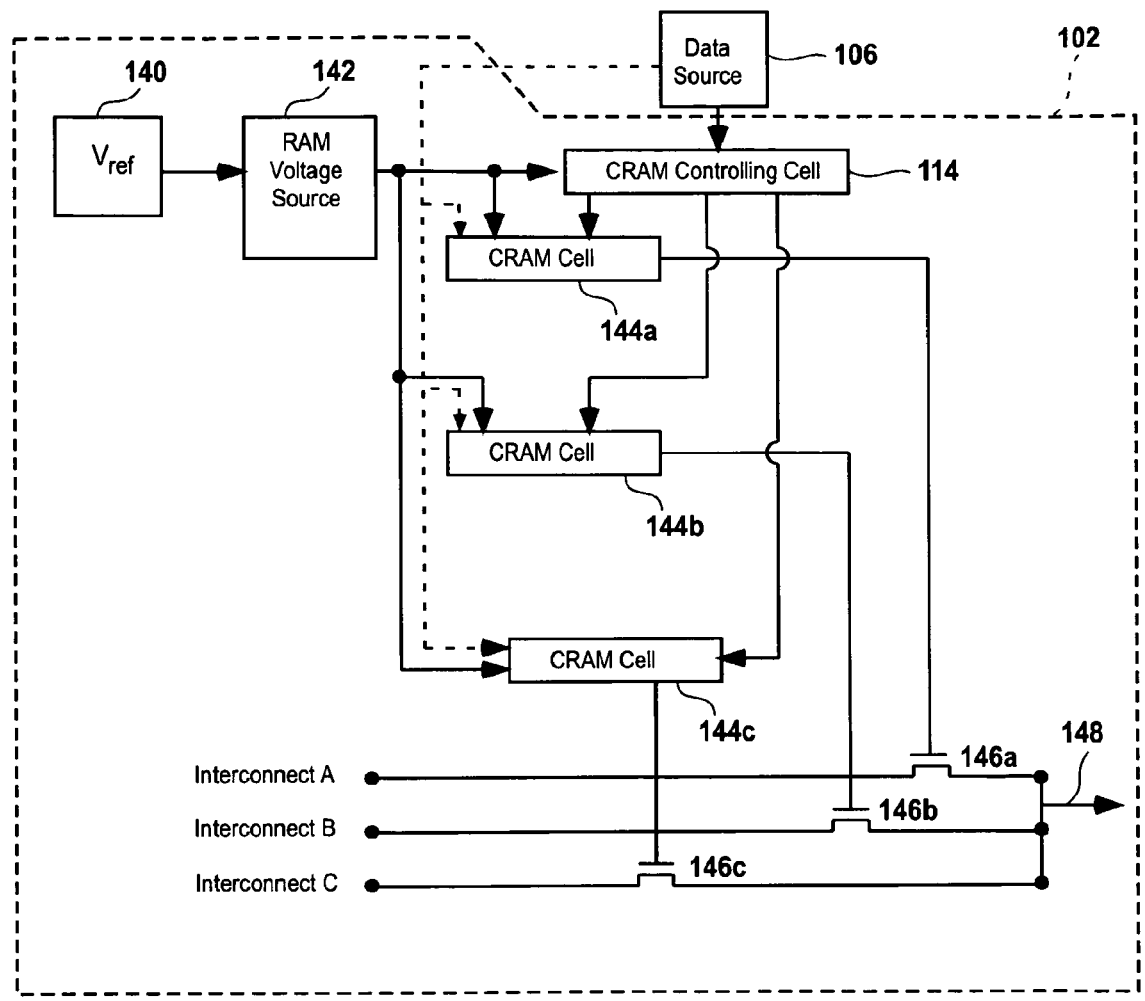
FIG. 3 is a simplified schematic diagram illustrating a portion of a PLD and the programmable interconnects contained therein in accordance with one embodiment of the invention.

FIG. 3 is a simplified schematic diagram illustrating a portion of a PLD and the programmable interconnects contained therein in accordance with one embodiment of the invention. PLD 102 loads the corresponding CRAM cells 144a-c with logical values received from data source 106. As mentioned above, data source 106 may also provide user specified data to CRAM cells 144a-c that determines the configuration and functionality of PLD 102. Data source 106 also provides programmable power levels to CRAM controlling cell 114. These programmable power levels provide a logical signal, e.g., a logical 1 value or a logical 0 value, to corresponding CRAM cells 144a-144c. In one embodiment, where a block is unused within the PLD 102, the programmable power level supplied to the corresponding CRAM cell from CRAM controlling cell 114 eliminates source to drain leakage, which occurs when stand-by power is provided to the corresponding CRAM cell. As illustrated, CRAM cells 144a-144c provide control signals to respective transistors 146a-146c in order to determine the connectivity within PLD 102.

Depending on the data bit stored in CRAM cells 144a-144c of FIG. 3, each of the control signals may "turn on" the corresponding transistors 146a-146c or "turn off" the corresponding transistors. Where transistors 146a-146c are N-type metal oxide semiconductor transistors, a logic high value to one of the control signals "turns on" the respective n-type transistor. Thus, when one of transistors 146a-146c is activated, the transistor couples the corresponding interconnect with trace 148. Conversely, a logic low value to one of the control signals to transistors 146a-146c turns off the respective transistor. Here, the transistor prevents connecting to trace 148. Thus, by programming CRAM cells 144a through 144c a user can selectively couple the interconnects to trace 148, as desired, and thus define a programmable interconnect within the PLD 102. The embodiments described herein, significantly reduce the standby power consumption for the CRAM cells 144a-c that are associated with an unused portion of the PLD through the programmable power levels. It should be appreciated that transistors 146a-c may be P-type transistors that are turned off by a logic high signal, rather than the N-type transistors. Additionally, it will be apparent to one skilled in the art that transistors 146a-c may be referred to as pass gate transistors.

Reference voltage source 140 of FIG. 3 supplies a voltage to RAM voltage source 142. RAM voltage source 142 derives a voltage from the voltage at output of $V_{ref}$ 140. The voltage at the output of RAM voltage source 142 may be set to any suitable desired level. In one embodiment, RAM voltage source 142 may be eliminated along with reference voltage source 140.

Figure 4:
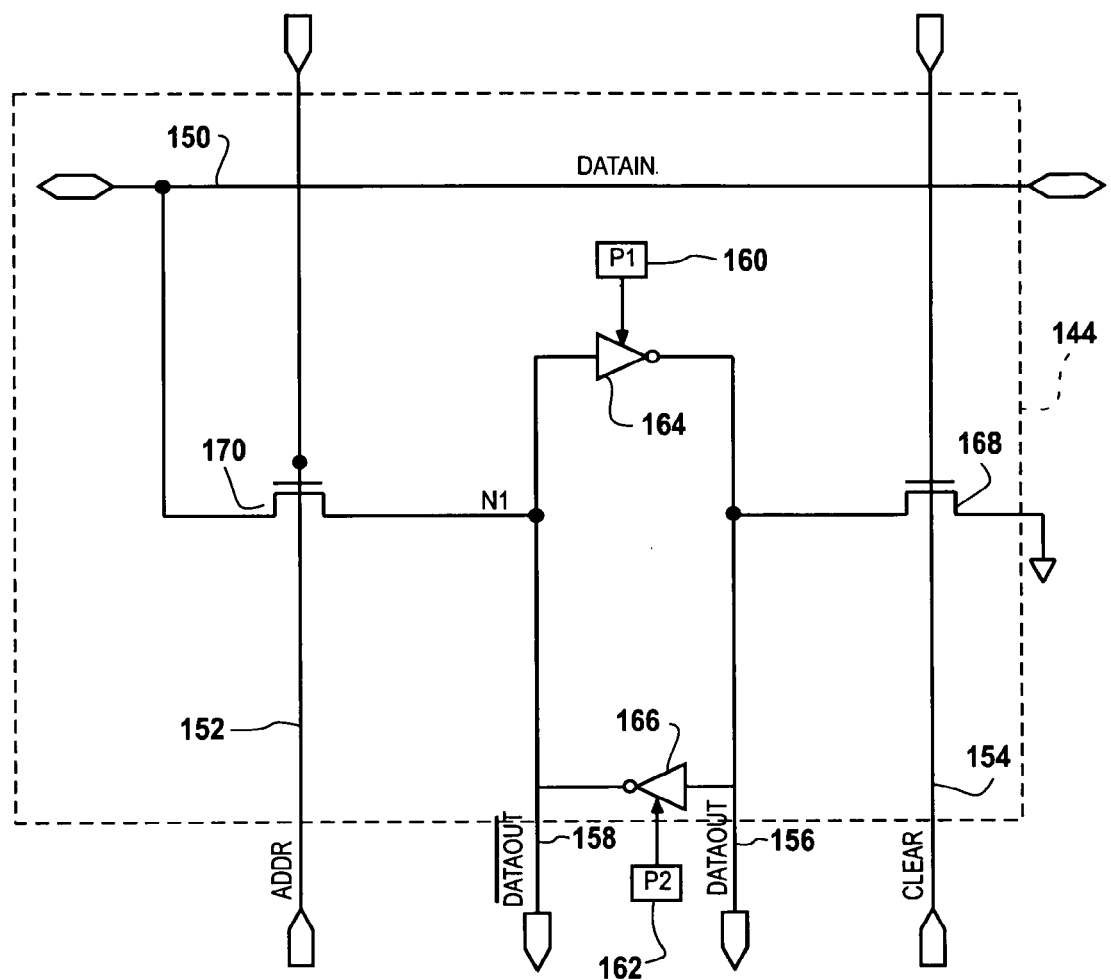
FIG. 4 is a simplified schematic diagram illustrating an exemplary CRAM cell in accordance with one embodiment of the invention.

FIG. 4 is a simplified schematic diagram illustrating an exemplary CRAM cell in accordance with one embodiment of the invention. CRAM cell 144 includes a pair of inverters 164 and 166, which are cross-coupled. In one embodiment, CRAM cell 144 is a static random access memory (SRAM) cell. When in use, clear trace 154 is driven low, while DATAIN trace 150 is driven high. During programming of CRAM cell 144, cross coupled inverters 164 and 166 are cleared by having clear trace 154 driven high and address trace 152 driven low. CRAM cell 144 is then programmed after being cleared, thereby causing address trace 152 to be driven high while clear trace 154 is driven low. In addition, programmable power levels P1 160 and P2 162 are provided to inverters 164 and 166, respectively. Thus, when CRAM cell 144 is not in use, i.e, is associated with an unused portion of the PLD, and as such, does not activate the corresponding pass gate transistor, P1 160 and P2 162 may be set to a logical low state in order to prevent leakage between the source and drain of corresponding transistors of inverters 164 and 166. Therefore, when CRAM cell 144 is not in use, the power consumption can be cut by at least 50% through programmable power levels P1 160 and P2 162. It should be appreciated that the programmable power levels may originate from CRAM controlling cell 114 with reference to FIGS. 2A, 2B, and 3.

As illustrated in FIG. 4, address trace 152 activates transistor 170 to enable a signal from DATAIN trace 150 to pass through to node N1. The signal at node N1 is then stored in the storage cell composed of cross-coupled inverters 164 and 166. Clear trace 154 controls the activation of transistor 168. When transistor 168 is activated, the output of inverter 164 is kept at ground and thus erases the storage cell contents. As will be explained with more detail with respect to FIG. 5, when the output of inverter 164 is kept at ground and the signal at node N1 is at a logical high state, DATAOUT trace 156 is driven low through transistor 168 and a transistor of inverter 164. Thus, the output of inverter 164 is driven low by two NMOS transistors and is less susceptible to noise on DATAOUT trace 156.

Figure 5:
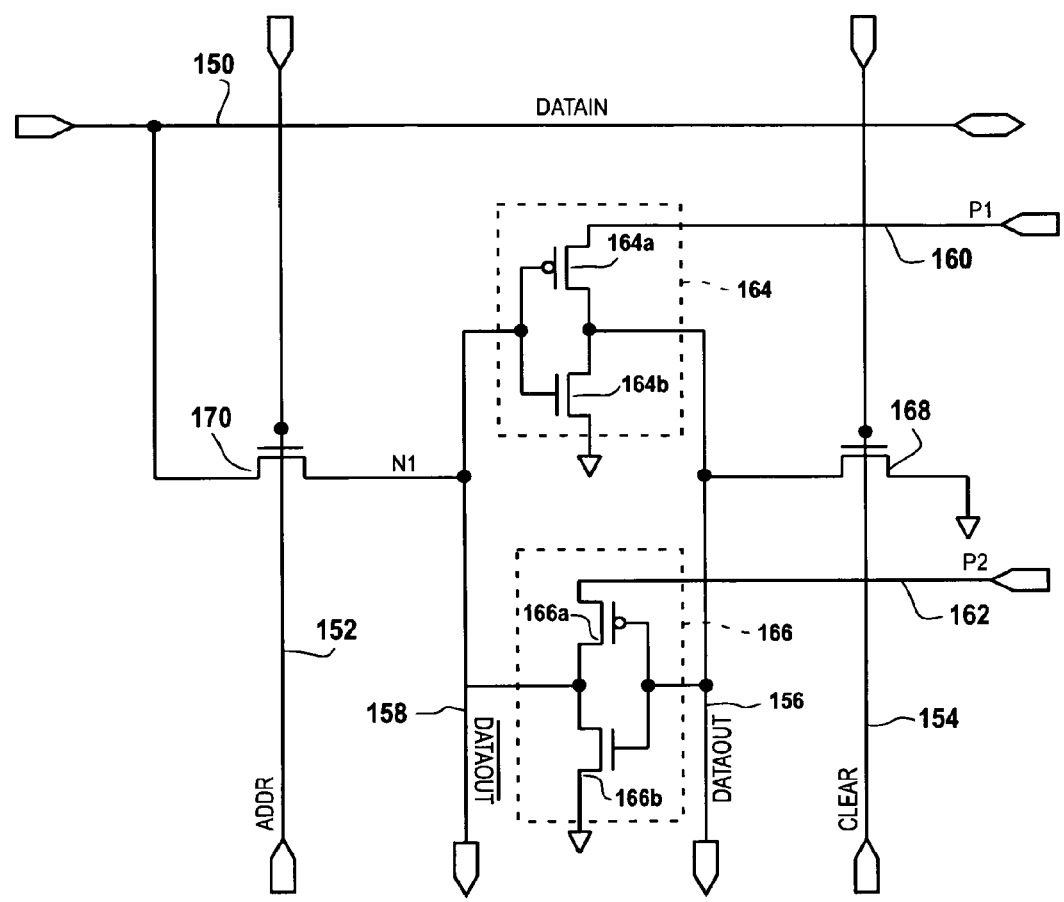
FIG. 5 is a simplified schematic diagram illustrating in more detail the embodiment depicted in FIG. 4.

FIG. 5 is a simplified schematic diagram illustrating in more detail the embodiment depicted in FIG. 4. Here, the details of inverters 164 and 166 are provided. Inverters 164 and 166, of FIG. 4 are illustrated as a cross-coupled pair forming an SRAM cell. Referring back to FIG. 5, P-type metal oxide semiconductor (MOS) transistor 164a and N-type MOS transistor 164b form a first inverter. A second inverter is defined by P-type MOS transistor 166a and N-type MOS transistor 166b. It should be appreciated that when programmable power level P1 on trace 160 is low and programmable power level P2 on trace 162 is high, the leakage is cut in half, since power is supplied to half, i.e., one of two inverters, of the SRAM cell. In this embodiment, node N1 is at a logical high state and drives DATAOUT trace 156 low since transistor 168 provides a connection to ground. As mentioned above, an advantage is obtained since the output node is driven low by NMOS transistors 168 and 164b, which are both at ground when activated. It should be appreciated that this will hold a low signal better against any noise on DATAOUT trace 156. In addition, when programmable power levels P1 160 and P2 162 are both low, there is no leakage from the power to ground since the power is at ground. Clear trace 154 propagates a logical high signal and therefore keeps the output node at ground. It should be appreciated that the savings may be substantial in these embodiments because all the CRAM cells, including a significant number of CRAM cells associated with unused portions of the PLD, were previously always powered and as features are becoming smaller and smaller the leakage between the source and drain of the corresponding CMOS transistors is becoming greater.

Still referring to FIG. 5, one skilled in the art will appreciate that inverter 164 may be provided a programmable power level deactivating the inverter, i.e., P1 is a logical 0, but DATAOUT and $\overline{\text{DATAOUT}}$ signals may be used as input to a logical block. Thus, half of the SRAM cell is powered off or deactivated to prevent source to drain leakage, however, the DATAOUT and $\overline{\text{DATAOUT}}$ signals may be used to drive a logic block. In one embodiment, the logic block is a multiplexer requiring two inputs. In this embodiment, where upper inverter 164 is deactivated by programmable power level P1, DATAOUT has a value of a logical 0, while $\overline{\text{DATAOUT}}$ has a value of a logical 1. Where both inverters 164 and 166 are turned off through the programmable power levels, i.e. DATAOUT is not needed, and both DATAOUT and DATAOUT will have logical 0 values.

In summary, the above-described invention provides a method and apparatus for reducing standby power consumption as feature sizes continue to shrink. The embodiments described herein provide a scheme to shut down unused CRAM cells in a PLD, thereby saving power. In one embodiment, dedicated CRAM cells are provided to control the shutdown per block. A portion, e.g., one of two inverters, of the CRAM cell may be shut down through the programmable power level. Alternatively, the entire CRAM may be shutdown by the programmable power level. One skilled in the art will appreciate that while the CRAM cell depicted herein was illustrated as a cross coupled pair of inverters, this is not meant to be limiting. That is, the embodiments may be applied to any suitable storage cell. In addition, a mechanism to keep a shutdown CRAM cell driving a logic zero is provided. In this mechanism two NMOS transistors are driving a signal low in order to make the low signal less susceptible to any noise.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for programming a programmable logic device (PLD), comprising method operations of:
    identifying a used logic portion and an unused logic portion of the PLD;
    powering a configuration cell associated with the used logic portion thereby enabling connectivity to the used logic portion;
    transmitting a first logical signal to a configuration cell associated with the unused logic portion thereby disabling connectivity to the unused logic portion; and
    transmitting a second logical signal to the configuration cell associated with the unused logic portion thereby substantially eliminating leakage across a source and a drain of a first transistor within the configuration cell.

2. The method of claim 1, further comprising:
    transmitting a third logical signal to the configuration cell associated with the unused logic portion thereby substantially eliminating leakage across a source and a drain of a second transistor within the configuration cell.

3. The method of claim 1, further comprising:
    transmitting a third logical signal to the configuration cell associated with the unused logic portion, wherein the second logical signal and the third logical signal have opposing logical states.

4. The method of claim 1, wherein the configuration cell is associated with a respective logic connector enabling the connectivity when the respective logic connector is powered through the configuration cell.

5. The method of claim 1, further comprising:
    receiving a configuration of the PLD from an external memory source into a configuration controlling cell of the PLD; and
    transmitting a portion of the received configuration to the configuration cell within the PLD.

6. The method of claim 1, wherein the method operation of transmitting a second logical signal to the configuration cell associated with the unused logic portion thereby substantially eliminating leakage across a source and a drain of a first transistor within the configuration cell includes,
    causing the configuration cell to draw at least 50% less power as compared to a standby power draw of the powered configuration cell.

7. The method of claim 6, wherein the method operation of causing the configuration cell to draw at least 50% less power as compared to a standby power draw of the powered configuration cell includes,
    asserting a logical signal to an input terminal of a transistor included within an inverter, the logical signal eliminating source to drain leakage across the transistor.

* * * * *